(12) United States Patent
Liu et al.

(10) Patent No.: US 7,607,792 B2
(45) Date of Patent: Oct. 27, 2009

(54) LIGHT-EMITTING DEVICES AND LENS THEREFOR

(75) Inventors: Ying Liu, Hong Kong (CN); Danding Huang, Hong Kong (CN); Shou Lung Chen, Hong Kong (CN); Chen-Jung Tsai, Hong Kong (CN)

(73) Assignee: Hong Kong Applieed Science and Technology Research Institute Co. LTd., Hong Kong Sar (CN)

( * ) Notice: Subject to any disclaimer, the term of this patent is extended or adjusted under 35 U.S.C. 154(b) by 0 days.

(21) Appl. No.: 11/643,877

(22) Filed: Dec. 22, 2006

(65) Prior Publication Data
US 2008/0151550 A1    Jun. 26, 2008

(51) Int. Cl.
*G09F 13/04* (2006.01)
(52) U.S. Cl. .............. 362/97.3; 362/296.1; 362/311.02; 362/311.12
(58) Field of Classification Search ......... 362/307–311, 362/318, 329, 332, 334, 335, 336, 338, 27, 362/555, 97.3, 311.03, 133.12; 257/98, 95, 257/E33.073; 313/498–500
See application file for complete search history.

(56) References Cited
U.S. PATENT DOCUMENTS

| | | | |
|---|---|---|---|
| 6,547,423 B2 * | 4/2003 | Marshall et al. ............. | 362/333 |
| 6,598,998 B2 | 7/2003 | West et al. | |
| 6,896,381 B2 * | 5/2005 | Benitez et al. ............... | 359/858 |
| 2005/0243576 A1 | 11/2005 | Park et al. | |
| 2006/0034097 A1 | 2/2006 | Hahm et al. | |
| 2006/0066218 A1 | 3/2006 | Yamaguchi et al. | |
| 2006/0138437 A1 * | 6/2006 | Huang et al. ................... | 257/98 |
| 2006/0198144 A1 | 9/2006 | Miyairi et al. | |
| 2007/0029563 A1 * | 2/2007 | Amano et al. .................. | 257/98 |
| 2007/0070530 A1 | 3/2007 | Seo et al. | |
| 2007/0263390 A1 * | 11/2007 | Timinger et al. ............ | 362/308 |

FOREIGN PATENT DOCUMENTS

| | | |
|---|---|---|
| CN | 1808728 A | 7/2006 |
| JP | 2007-53027 A | 3/2007 |
| WO | WO 2006/089523 A1 | 8/2006 |

OTHER PUBLICATIONS

International Search Report mailed Mar. 27, 2008 in International Application No. PCT/CN2007/071146.

* cited by examiner

*Primary Examiner*—Hargobind S Sawhney
(74) *Attorney, Agent, or Firm*—Buchanan Ingersoll & Rooney PC

(57) ABSTRACT

A light-emitting assembly for conditioning the light output of at least one light-emitting source for light guide coupling, comprising a lens and at least one light-emitting source, the light-emitting source having an optical output axis and the lens comprising a beam diverging portion for diverging or spreading light about the output axis, wherein the beam diverging portion of the lens is along the optical output axis and forward of the light-emitting source, and at least one beam converging portion for converging or compressing light away from the optical axis is adjacent the beam diverging portion.

19 Claims, 15 Drawing Sheets

Side view

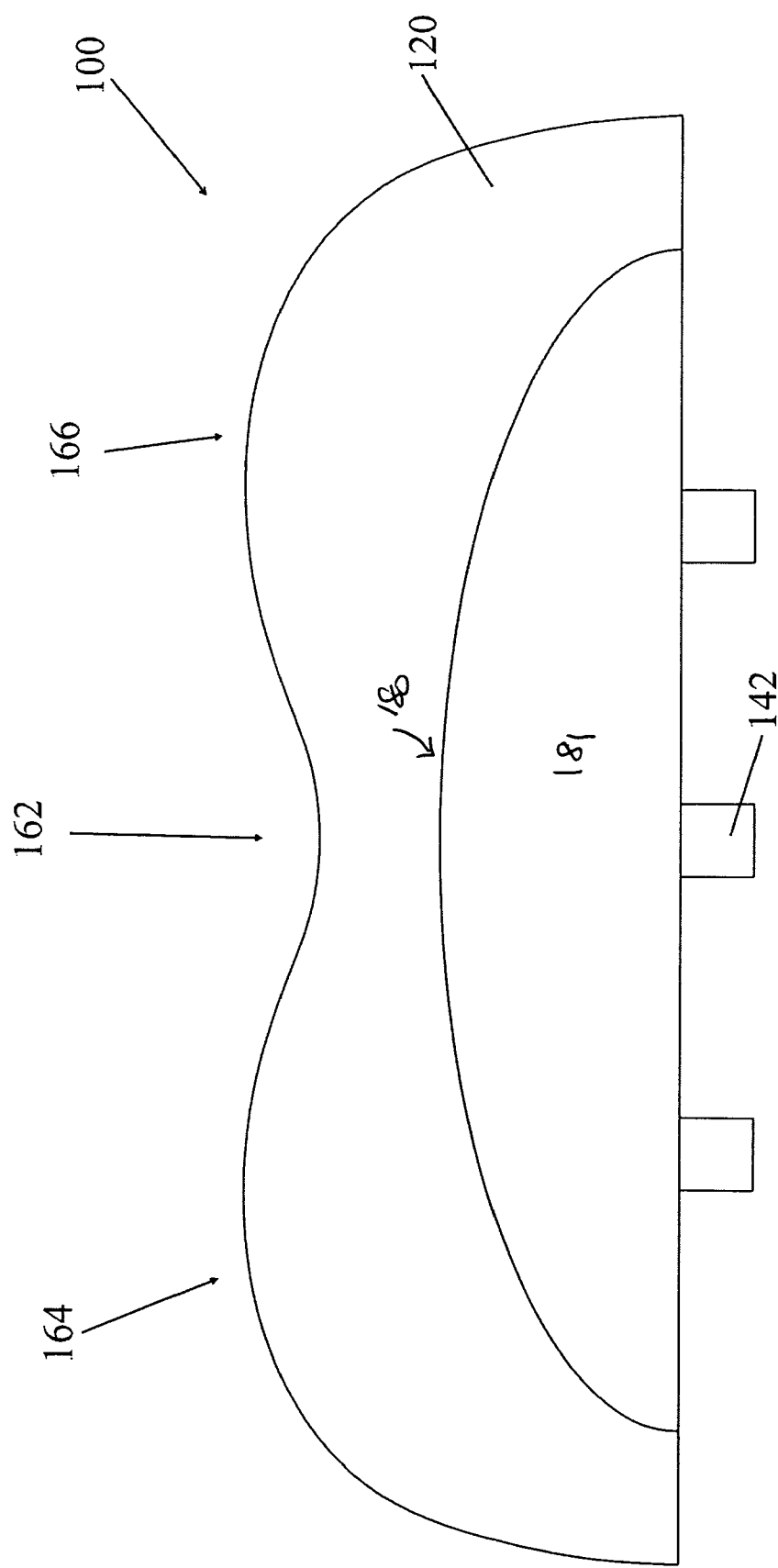

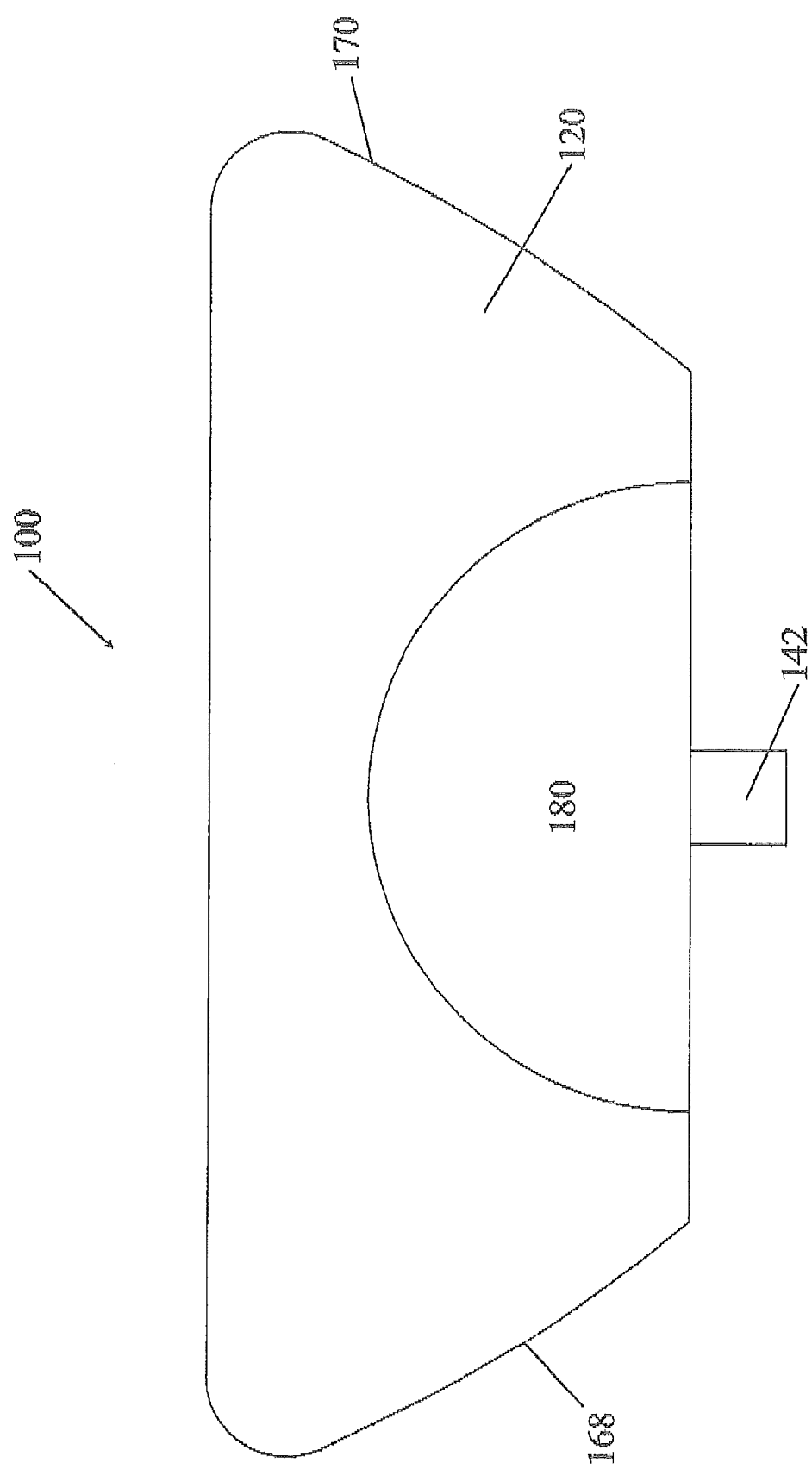

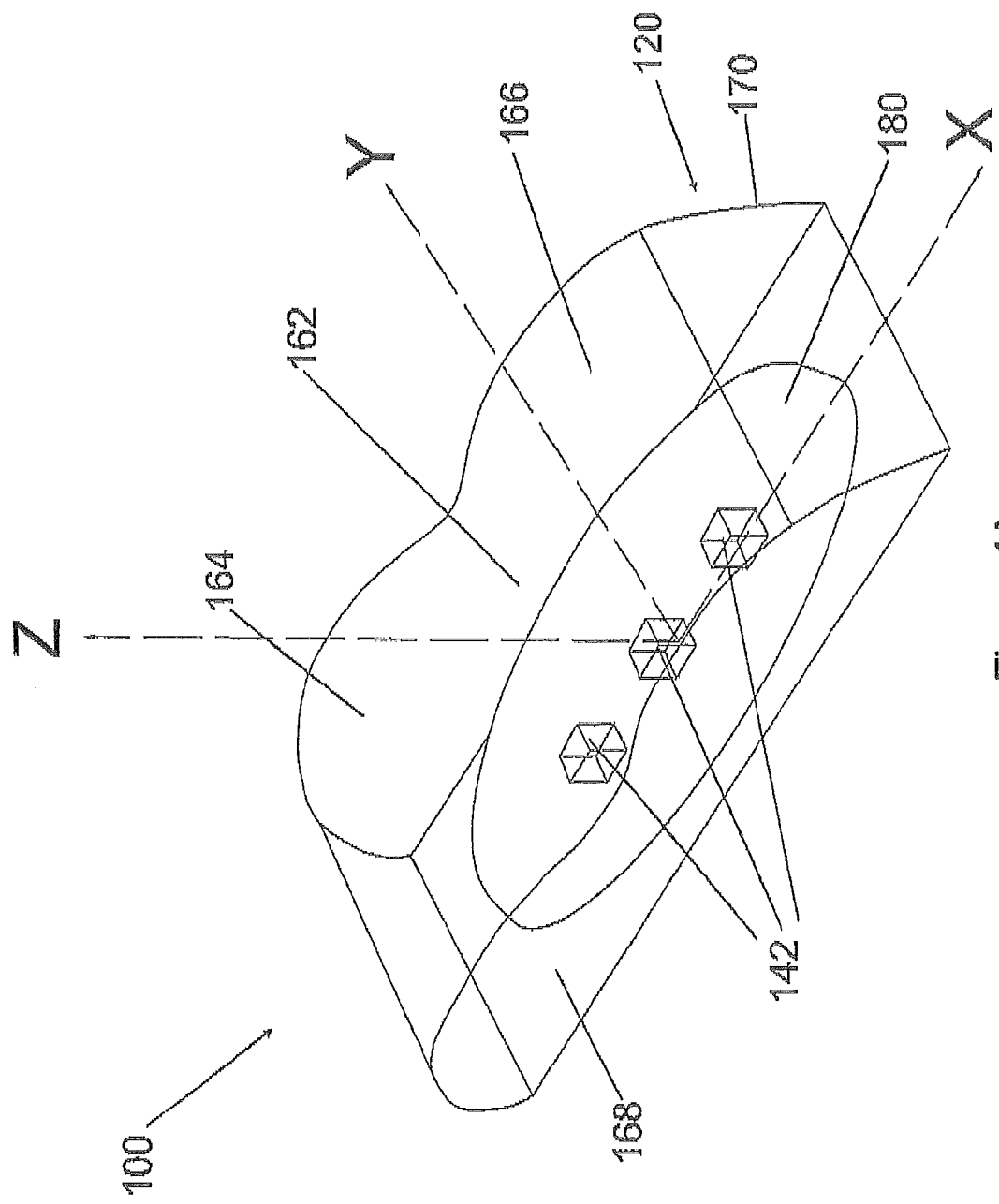

LIGHT-EMITTING DEVICES AND LENS THEREFOR

FIELD OF THE INVENTION

The present invention relates to light-emitting devices, and more particularly, to light-emitting devices for coupling light onto a light guide. More specifically, although not solely limited thereto, the present invention relates to a lens for conditioning the optical output of a light-emitting source for display applications, light-emitting assemblies comprising such a lens, and displays comprising such light-emitting assemblies.

BACKGROUND OF THE INVENTION

Many light-emitting sources have light intensity distribution characteristics which are more conveniently depicted by a graph showing a variation of light intensity with reference to radial angles in lateral directions, as described for example in US 2006-0034097A1.

Semiconductor light-emitting devices are finding increasingly more applications in modern day electronic devices. Typical semi-conductor light-emitting sources, for example, packaged light-emitting diodes (LED), are directional and have a characteristic optical axis along which light is propagated. Typically, the light intensity of an LED follows a Lambert distribution as depicted in FIG. 27 of US 2006-0034097A1. More particularly, a substantial portion of the entire light energy emitted by an LED is contained within an angular range centered about the optical axis and the angular range is commonly referred to as the "viewing angle" of an LED. The viewing angle ranges of an LED are typically between +/−15° to +/−60° about the optical axis.

In many applications involving the use of semiconductor light-emitting devices, it is desirable to condition the optical output of a light-emitting source to suit various objectives. For example, a typical liquid crystal (LCD) display is equipped with a backlight apparatus which comprises an array of LEDs for illuminating an LCD panel from behind since the LCD display panel is not self-illuminating. An example of such a backlight apparatus is described in US 2005-0243576A1. In general, a display panel comprises a plurality of parallel light guides onto which optical output from an array of light-emitting sources are coupled. An illustrative diagram of a display comprising a light guide assembly (10) and an array of edge-lighting LEDs (20) with a typical LED-to-LED pitch of 2-10 mm are depicted in FIGS. 1 and 1A. The entirety of the illuminated light guide assembly defines a useful display area (14).

In such or other similar applications, it is desirable to mix optical outputs from a plurality of light-emitting sources, for example, LEDs (20) of the three primary colours, red (R), green (G) and blue (B), to prepare for forward transmission to light guide (12). The mixing of light from a plurality of LEDs, for example, LEDs emitting the three primary colours is advantageous, since by separating the LEDs into a plurality of distributed locations and then by mixing light from the plurality of distributed sources, problems associated with the high power dissipation and the consequential thermal loading of a high power discrete white LED can be alleviated. However, typical distribution characteristics of a typical LED means that a relatively large distance, compared to the length of a display panel, will be required for light mixing. Therefore, it will be highly desirable if there can be provided optical arrangements for reducing the light mixing distance between a plurality of LED.

Furthermore, with the ever increasing LED power efficiency (lumen/watt), the number of LEDs required for each display will decrease significantly therefore the LED-to-LED pitch is substantially increased. However, an increase in the LED-to-LED pitch will also require an increase of the light mixing area, as depicted schematically in FIGS. 2, 2A and 2B with an exemplary LED-LED pitch (d) of more than 10 mm.

An exemplary optical arrangement for conditioning outputs of an LED for forward transmission is described in U.S. Pat. No. 6,598,998. However, such an arrangement requires a double molding process and still requires has relatively long light mixing distance. Another example of such an optical arrangement is described in US 2006-0034097A1 in which the lens has a relatively complicated structure and the light mixing distance is still relatively long.

Therefore, it will be desirable if there can be provided lens and light-emitting assemblies which would mitigate shortcomings of the known art.

SUMMARY OF THE INVENTION

According to the present invention, there is provided a light-emitting assembly for conditioning the light output of at least one light-emitting source for light guide coupling, comprising a lens and at least one light-emitting source, said light-emitting source having an optical output axis and said lens comprising a beam diverging portion for diverging or spreading light about said output axis, wherein said beam diverging portion of said lens is along said optical output axis and forward of said light-emitting source, and at least one beam converging portion for converging or compressing light away from said optical axis is adjacent said beam diverging portion.

By having a lens with a beam spreading portion which is co-axial with the optical axis of the light-emitting source, coupled with an adjacently disposed beam converging portion so that light outside the light spreading region will be compressed away from the optical axis of the LED, a more broadened light radiating pattern for more efficient light mixing can be provided.

For a light emitting assembly disposed intermediate the extremities of an array, another beam converging portion may be adjacent said beam diverging portion such that said beam diverging portion of said lens is intermediate a pair of beam converging portions.

For more efficient coupling onto a thin light guide, both said beam diverging portion and said pair of beam converging portions may be intermediate a pair of beam collimating lens portions, and said pair of beam collimating lens portions may be adapted for collimation light from said light-emitting source onto an optical guide.

In such an arrangement, both said beam diverging portion and said pair of beam converging portions are for diverging and converging light respectively along a first plane, and said pair of beam collimating lens portions are for collimating light towards said first plane.

In a preferred example, the beam converging portion comprises a double concave lens which is adapted for refracting light originating from said light-emitting source to exit from said beam converging portion at a substantially constant exit angle upon transition through said beam converging portion.

In a convenient example, said lens comprises a light collecting compartment within which said light-emitting source is seated, and the surface of said light collecting compartment which is proximal to said light-emitting source is concave.

The light collecting concave compartment may be filled with a transparent filler such as silicone. Such a transparent filler may be used to modify the divergent and/or convergent characteristics due to a difference in refraction index.

In a preferred example, the distal surface of said light diverging portion is concave and the distal surface of said beam converging portion is convexly curved.

In a light-emitting assembly comprising a packaged LED, said light-emitting source has a characteristic viewing angle which defines an angular extent about the light-emitting source within which most optical output of said light-emitting source is contained, and said light converging portions are immediately outside the projection of said viewing angle.

In a convenient example, said beam converging portion may comprise a convex lens portion, and said convex lens portion is configured so that light emitted from a light-emitting source on one side of said convex lens portion exits from the convex side of said convex lens portion at a substantially constant exit angle.

More particularly, said beam diverging portion is adapted for diverging optical output of said light-emitting source away from the optical output axis of said light-emitting source, and said beam converging portion is adapted for converging optical output of said light-emitting source also away from said optical output axis.

More specifically, although not necessary, the beam converging portion is configured to compress or condense light substantially orthogonally from the optical axis.

In a preferred example, said beam diverging portion comprises a double concave lens portion, and the optical axes of said double concave portion and said light-emitting source are parallel or substantially co-axial.

More conveniently, said beam diverging portion is for diverging light along a first optical plane, and said lens may further comprise a beam collimating lens for collimating optical output of said light-emitting source towards a second optical plane, said second optical plane being substantially parallel to said first optical plane.

In a preferred aspect of this invention, there is provided a light-emitting module comprising a plurality of light-emitting assemblies described herein and arranged in an array.

In addition, this invention has also described a display comprising a light-emitting module described above.

According to another aspect of this invention, there is provided a lens for conditioning the optical output of a light-emitting source having an optical output axis and a characteristic viewing angle for coupling onto a light guide, wherein said lens comprises a beam diverging portion and at least one beam converging portion, said beam diverging portion has an optical axis which is adapted to be parallel or substantially co-axial with the optical output axis of said light-emitting source; and being adapted to diverge light coming from said light-emitting source, and said at least one beam diverging portion is adjacent said beam diverging portion and is adapted to converge light coming from said light-emitting source away from said light-emitting source.

In a preferred embodiment, the lens may further comprise another beam convergent portion adjacent to said beam divergent portion, wherein said beam diverging portion is intermediate said beam converging portions, said at least one beam diverging portion is for refracting optical signal coming form said light-emitting source to diverge along a first plane, and said beam converging portions are adapted for converging optical signal coming from said light-emitting source on said first plane and away from said optical output axis.

For example, said beam converging portions are outside the viewing angle projection of said light-emitting source.

In a specific embodiment, said lens may comprises a light collecting compartment for receiving said light-emitting source, and the surface of said light collecting compartment which is proximal to said light-emitting source is concave.

For example, said beam converging portion may comprise a convex lens portion, and said convex lens portion may be configured so that light emitting from a point source on one side of said convex lens portion will exit from the convex side of said convex lens portion at a substantially constant exit angle.

In a further aspect of this invention, there is provided an optical device for collimating light beam from a light source with a wide emission angle so that the emergent light has a narrowed angle of emission.

BRIEF DESCRIPTION OF THE DRAWINGS

Preferred embodiments of the present invention will be explained in further detail below by way of examples and with reference to the accompanying drawings, in which:—

FIG. 3 is a cross-sectional view of a light-emitting assembly along the XY plane, FIG. 3A is a cross-sectional view of a light-emitting assembly of FIG. 3 along the YZ plane.

DETAILED DESCRIPTION OF THE PREFERRED EMBODIMENTS

Figure 1:
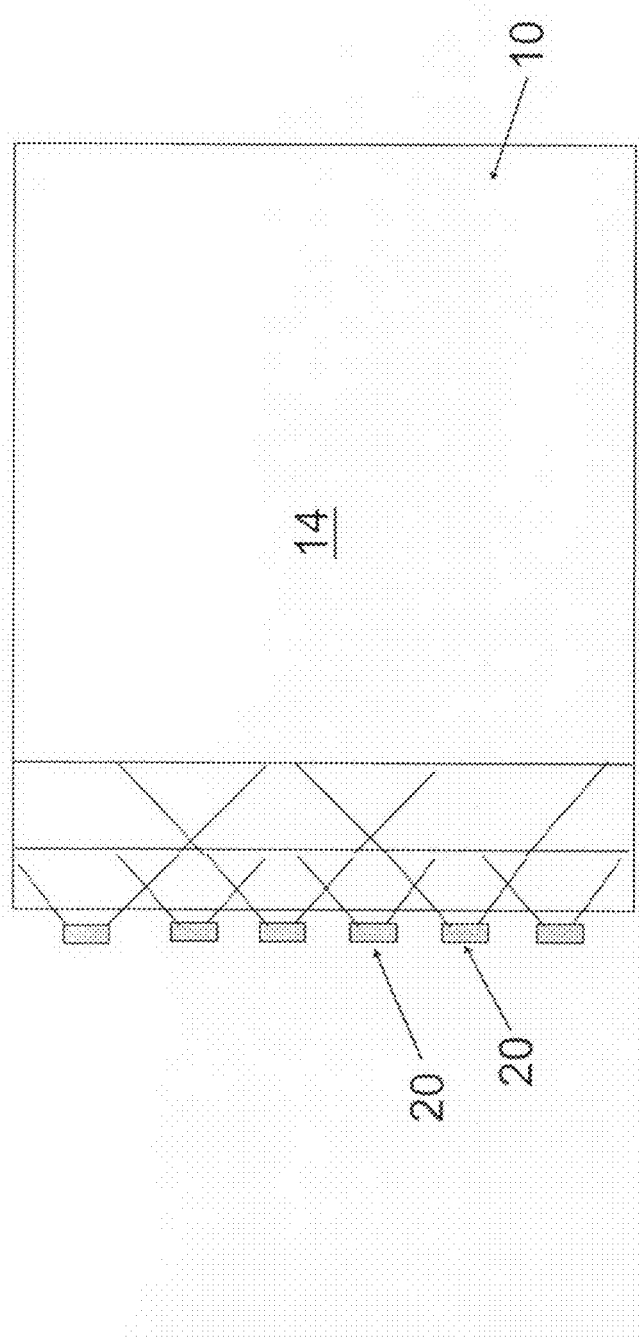
FIG. 1 is a schematic diagram illustrating a display comprising a light guide assembly and an array of edge-lighting LEDs.
Figure 1A:
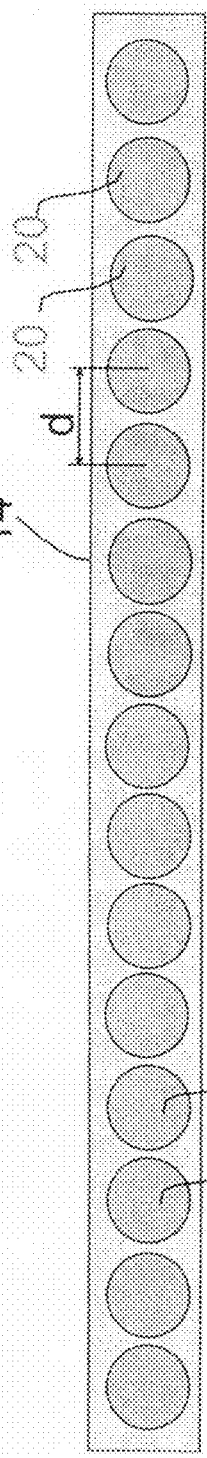
FIG. 1A is a schematic diagram depicting a side view of the array of LEDs of FIG. 1.
Figure 2:
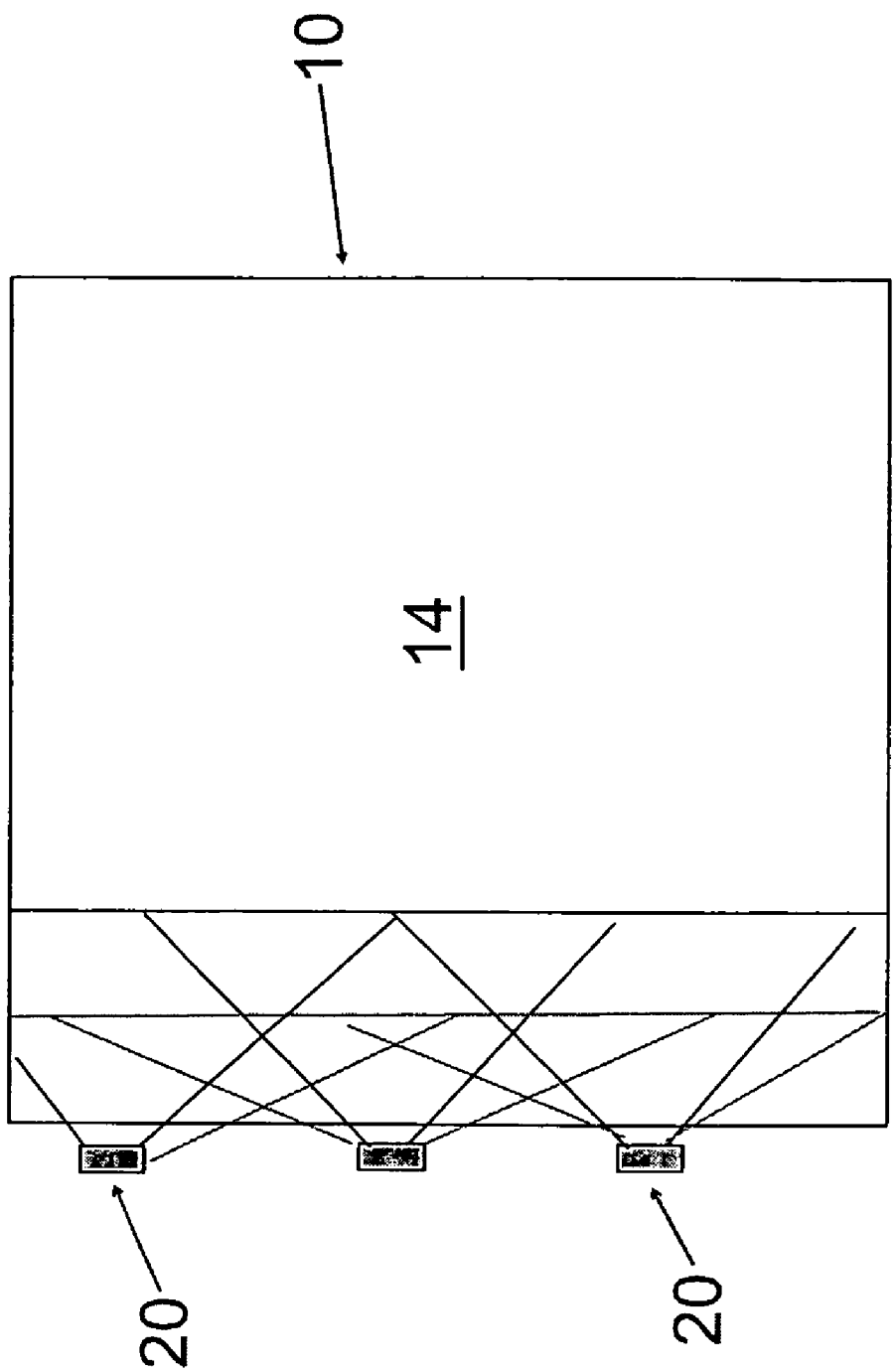
FIG. 2 is a schematic diagram illustrating a display having an array of LEDs with a larger LED-to-LED pitch.
Figure 2A:
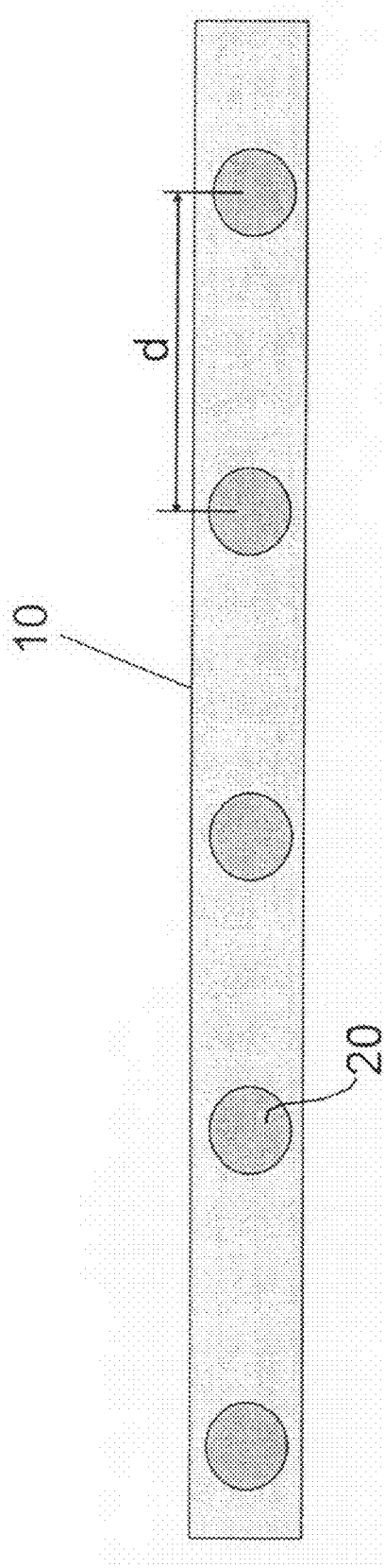
FIG. 2A is a schematic side view depicting the pitch layout of the LED layout of FIG. 2.
Figure 2B:
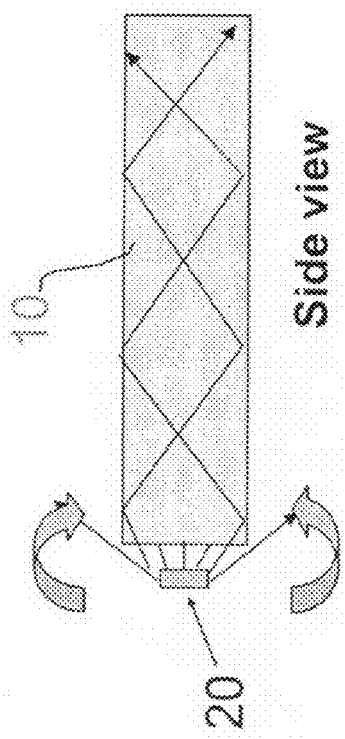
FIG. 2B illustrates schematically the coupling of light from an LED onto a light guide of a display.

As could be appreciated with reference to FIGS. 1 to 2B, it will be advantageous if the distance required for light mixing between a plurality of LEDs could be shortened so that the useful or effective length of a display can be maximized.

Referring to FIGS. 3 to 7A, a preferred embodiment of a light-emitting assembly of this invention comprises 100 a lens 120 and at least one light-emitting source 142. An LED is used as an example of a semiconductor light-emitting source as a convenient example since LEDs have become increasingly popular for application in modern day electronic applications. Like many semiconductor light-emitting sources, an LED has a characteristic optical axis and a characteristic "viewing angle" about which the bulk of the light energy generated by the LED is concentrated. As a result of a usually rather narrow viewing angle, a relatively large light-mixing distance is required.

Figure 5:
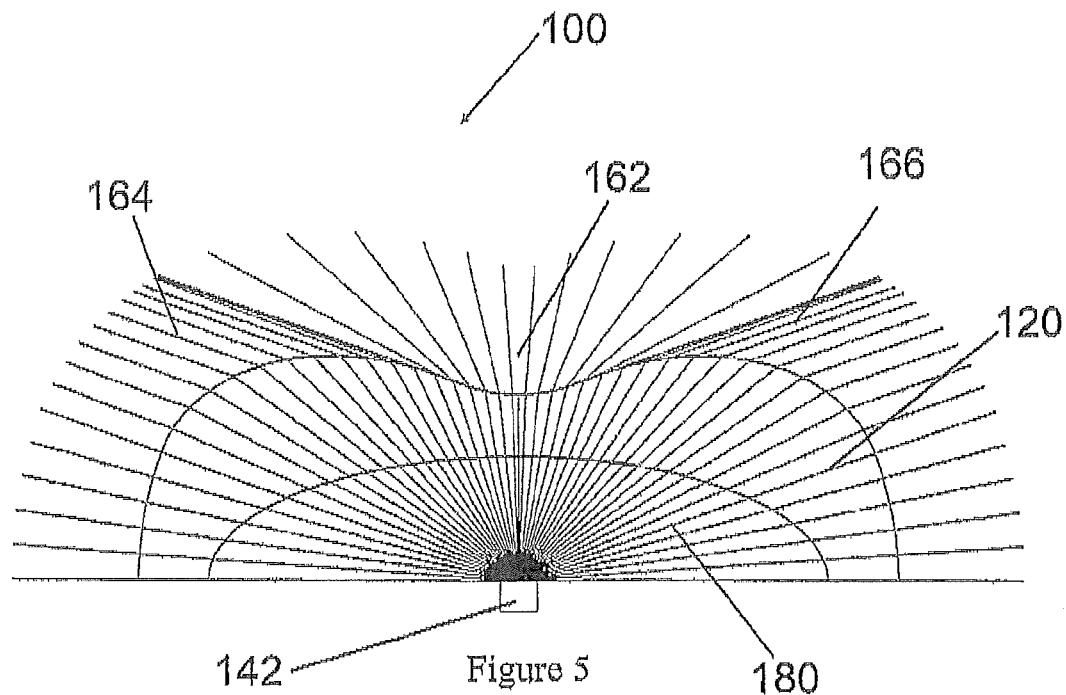
FIG. 5 is a schematic ray diagram illustrating operation of the light-emitting assembly of the preferred embodiment of to FIG. 3.

In order to alleviate shortcomings of conventional LEDs, the light-emitting assembly of this invention comprises a lens portion having a beam diverging portion for diverging or spreading light about the optical axis of the LED, as shown in the ray diagram of FIG. 5. By spreading light in the vicinity of the optical axis to diverge away from the optical axis, the concentration of light energy about the optical axis can be spread sideways and the radiation pattern is significantly broadened. In another perspective, the output of the LED in the proximity of the optical axis is equalized to form a beam with a wider distribution of light energy. By widening the light distribution about the optical axes, a more efficient light mixing with adjacent light-emitting sources can be accomplished in a shorter distance.

The cross-sectional view of FIG. 3 is taken along a plane which is parallel or coplanar with the display area of FIG. 1. The lens 120 comprises a beam diverging portion which is on the optical axis of the light-emitting source 142. In this specific example, the beam diverging portion comprises a double concave lens with the lens axis being co-axial with the optical axis of the LED 142. The beam diverging portion 162 spreads the light coming from the LED 142 so that the light density about the optical axis of the LED is less dense. A pair of beam converging portions 164, 166 is disposed adjacent the beam diverging portion so that the beam diverging portion 162 is intermediate the pair of beam converging portion along a transversal direction of FIG. 1 along the distribution of the array of LEDs of FIG. 1.

Figure 4:
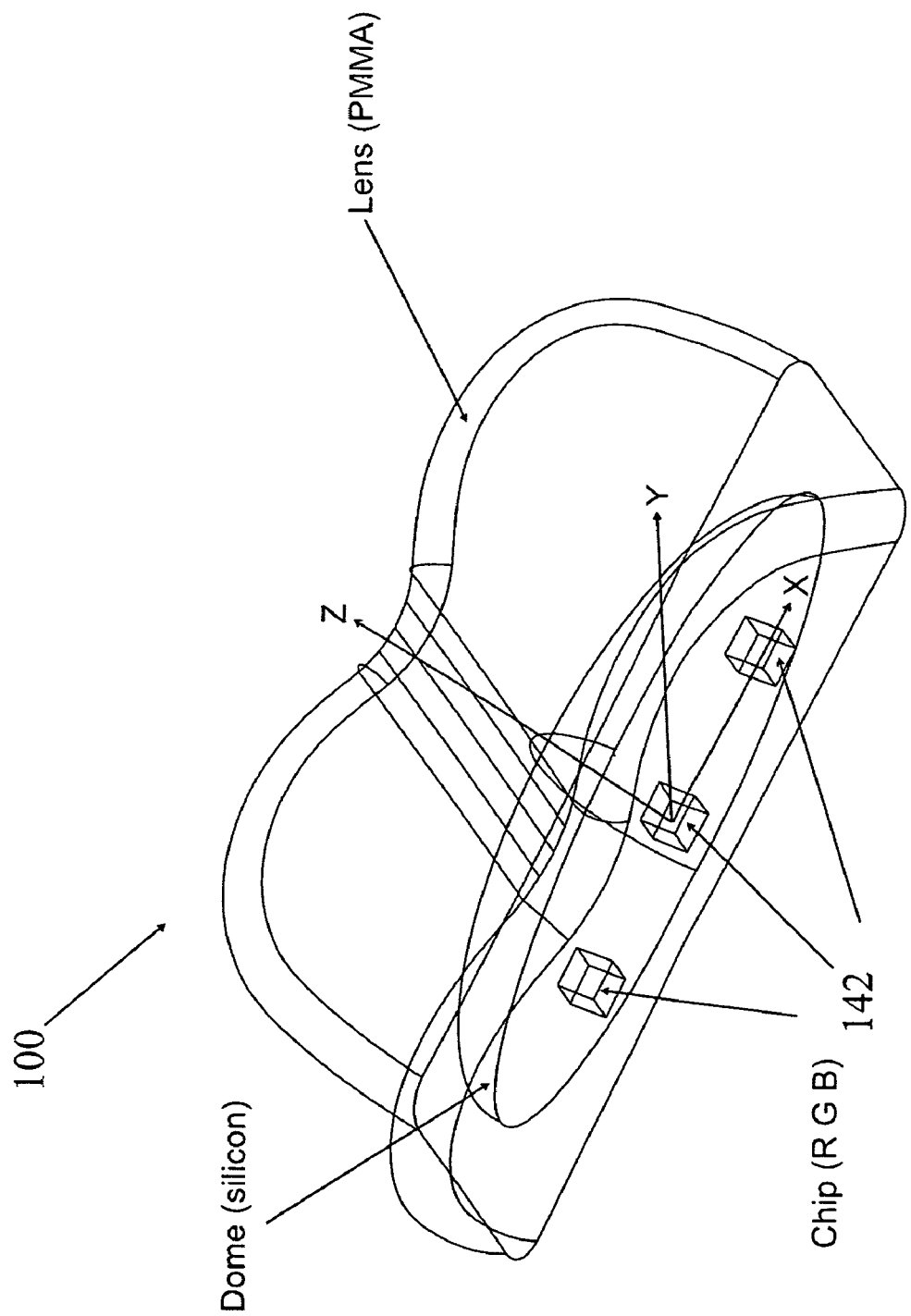
FIG. 4A is a schematic perspective view depicting a light-emitting assembly of this invention, including reference axes X, Y, Z.
FIG. 4B is a top view of the light emitting assembly of FIG. 4A.
Figure 4B:
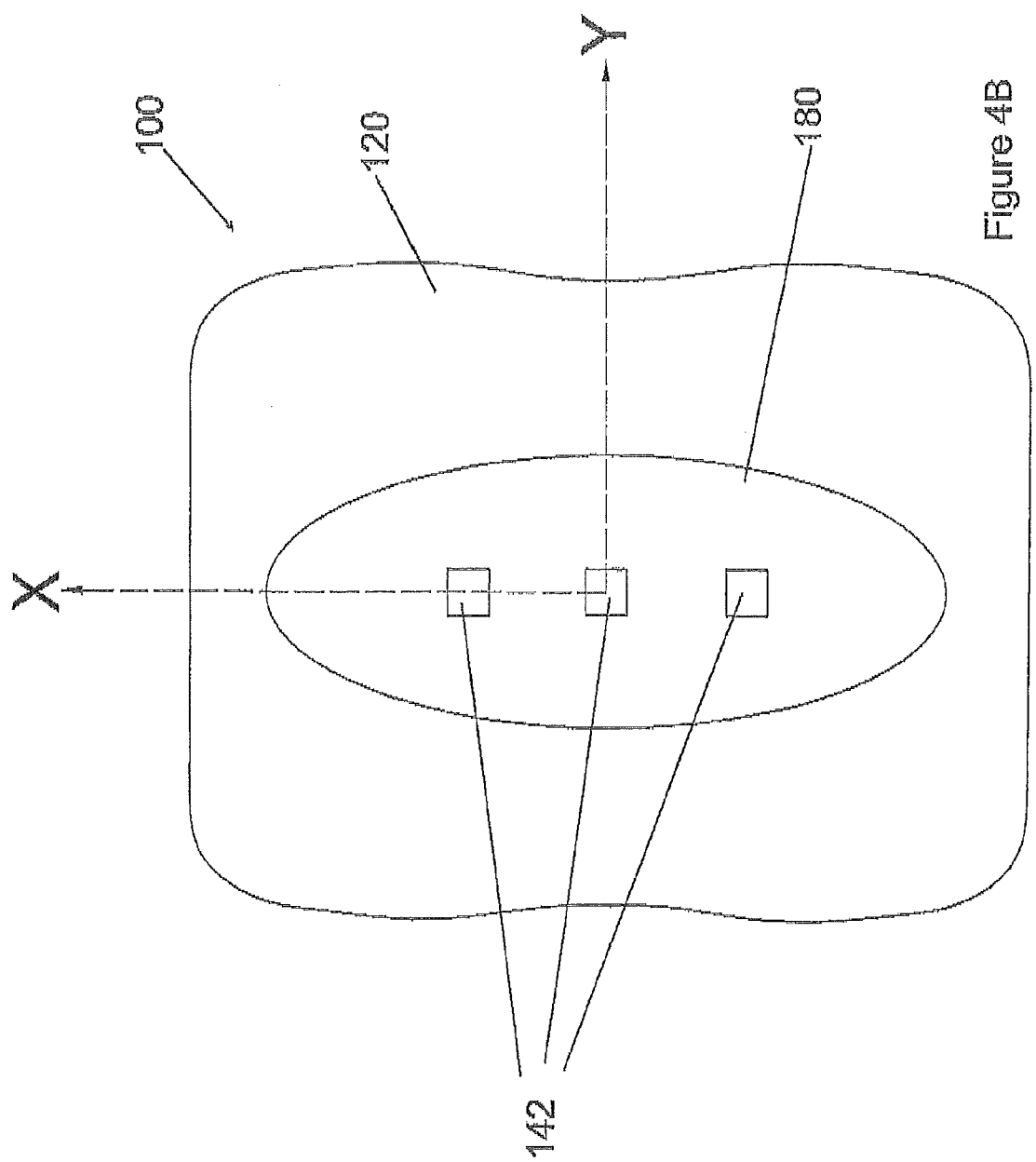

FIG. 4A is a schematic perspective view depicting a light-emitting assembly of this invention, including reference axes X, Y, Z. FIG. 4B is a top view of the light emitting assembly of FIG. 4A. As shown in FIG. 4A, a pair of collimating portions 168 and 170 is provided to confine the optical output.

Each of the beam converging portions comprises a convex external surface and a concave internal surface so that light transmitted from the LED source towards the light converging portions will be converged away from the optical axis, and towards the 90° and 270° orientation, with respect to the optical axis of the LED, which is at 0° or 360°. In other words, the light converging portions are configured to compress light so that the emergent light is substantially orthogonal to the optical axis of the LED. In the specific example, the light exiting from the light convergent portion is configured to exit at a constant angle of about 85° to the optical axis of the LED. As can be seen from FIG. 3, the concave surfaces of the beam diverging portions and the beam converging portions form a concave compartment 180 intermediate the lens body and the LED 142. This concave compartment 180 can be filled with a filler 181 of an appropriate index to modify the beam diverging and converging properties where appropriate. By disposing a beam diverging portion which is co-axial with the optical axis of the LED and with the beam diverging portion intermediate a symmetric pair of beam converging portions, a more broadened radiation pattern can be obtained and light mixing between an adjacent pair of LEDs can be accomplished within a shorter distance to minimize unused area on the display panel.

Figure 6:
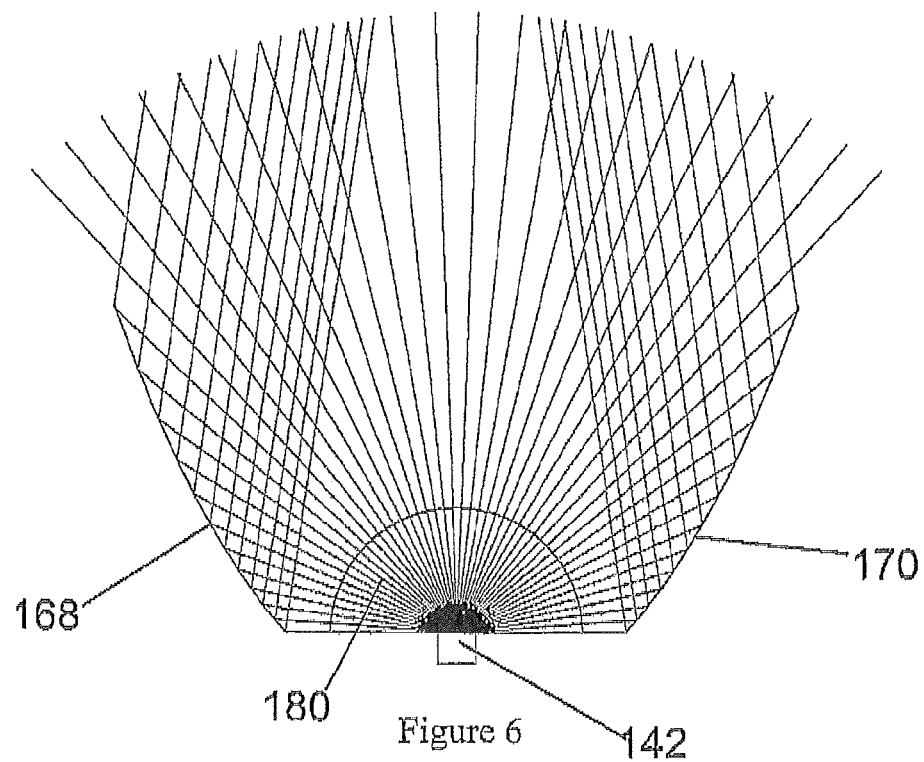
FIG. 6 is a schematic ray diagram illustrating operation of the light-emitting assembly of the preferred embodiment with reference to FIG. 3A.

Since the optical output from the light-emitting source is required to couple onto a thin light guide, light mixing is only required along a first plane, which is parallel to the useful display area of the panel shown in FIG. 1. The optical output of the light-emitting sources along a second plane, which is orthogonal to the first plane, could be collimated so that the optical output is confined within the thickness of the optical guide for optical coupling. To achieve this objective, a pair of collimating portions 168 and 170 are provided as shown in the orthogonal cross-section of the lens of Figures is as shown in FIG. 3A with the collimated beam rays more particularly depicted in FIG. 6. As shown in FIG. 6, the profile of the lens of FIGS. 3 and 3A along the orthogonal plane is substantially parabolic so that optical output from the light-emitting sources along the orthogonal plane can be collimated by the collimating portions 168 and 170 onto a relatively thin light guide as shown in FIG. 2B. By arranging the profile of the lens so that a light source with a wide emission angle is conditioned to output light within a narrow or angular range as exemplified in FIG. 6, the emitted light can be more efficiently coupled to a thin display.

Figure 7A:
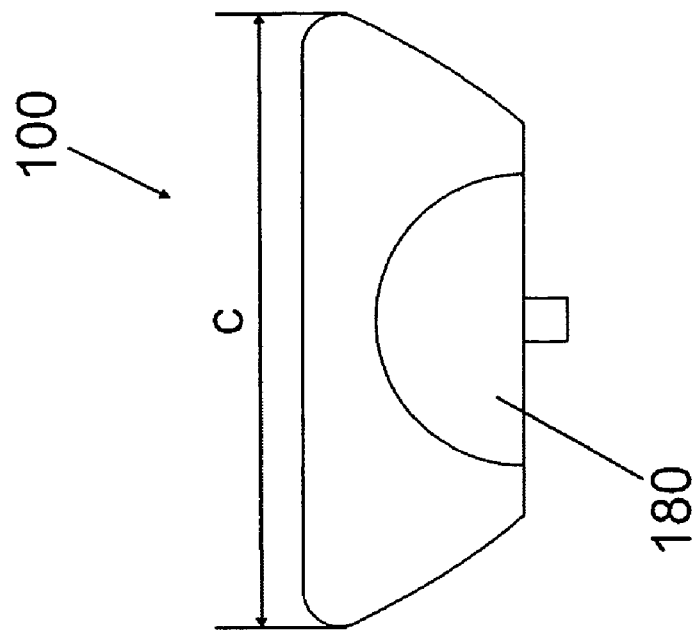
FIG. 7A illustrates an exemplary dimensioned configuration of the device of FIG. 3 along the view of FIG. 3A.
Figure 7:
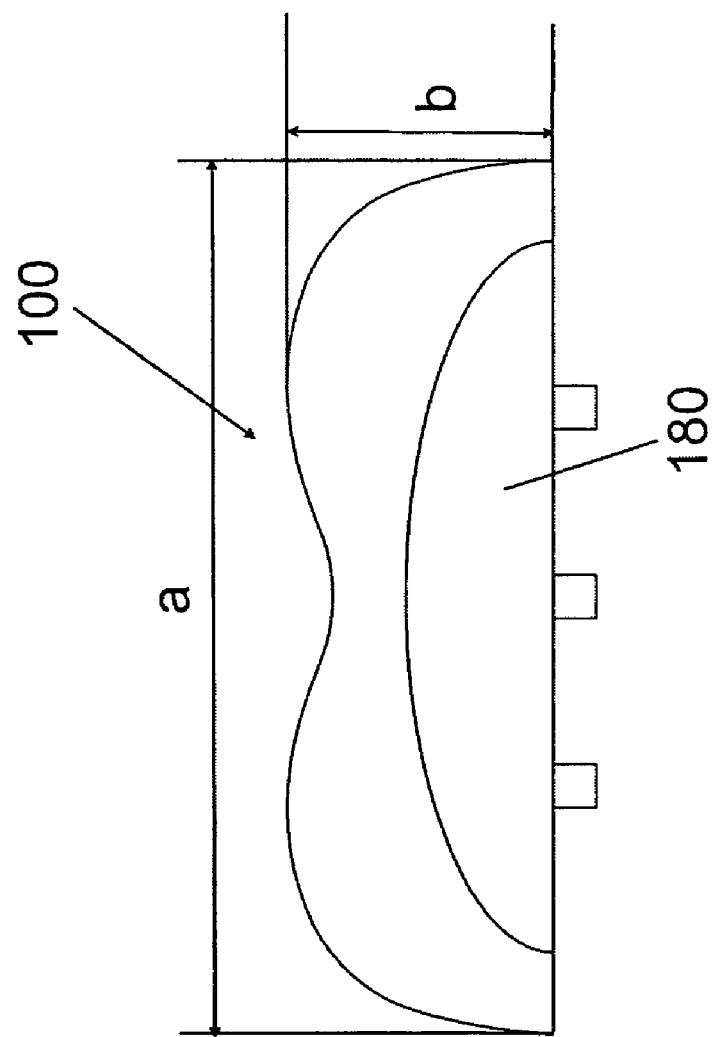
FIG. 7 illustrates an exemplary device of FIG. 3 with dimensions.

In an exemplary lens as shown in FIG. 7, the width (a) of the lens is 6 mm, with a thickness (b) of 1.8 mm and the transversal width of 5 mm (c), as shown in FIG. 7A.

Rather than having a single light-emitting source, a plurality of light-emitting sources can be accommodated in the concave compartment 180. For example, as shown in FIG. 3, three LEDs of the primary colours, namely, red, green and blue are adjacently disposed so that a more evenly mixed white backlight can be provided with a larger LED-to-LED spacing for forming on an array of FIG. 8 and FIG. 8A.

Figure 8:
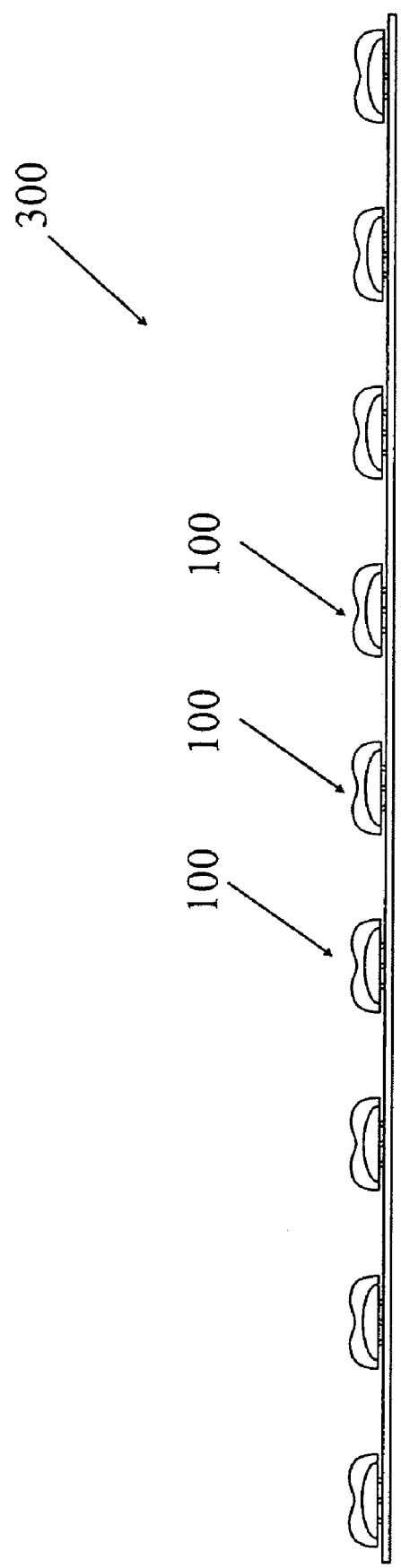
FIG. 8 illustrates an array comprising a plurality of light-emitting assemblies of this invention.
Figure 8A:
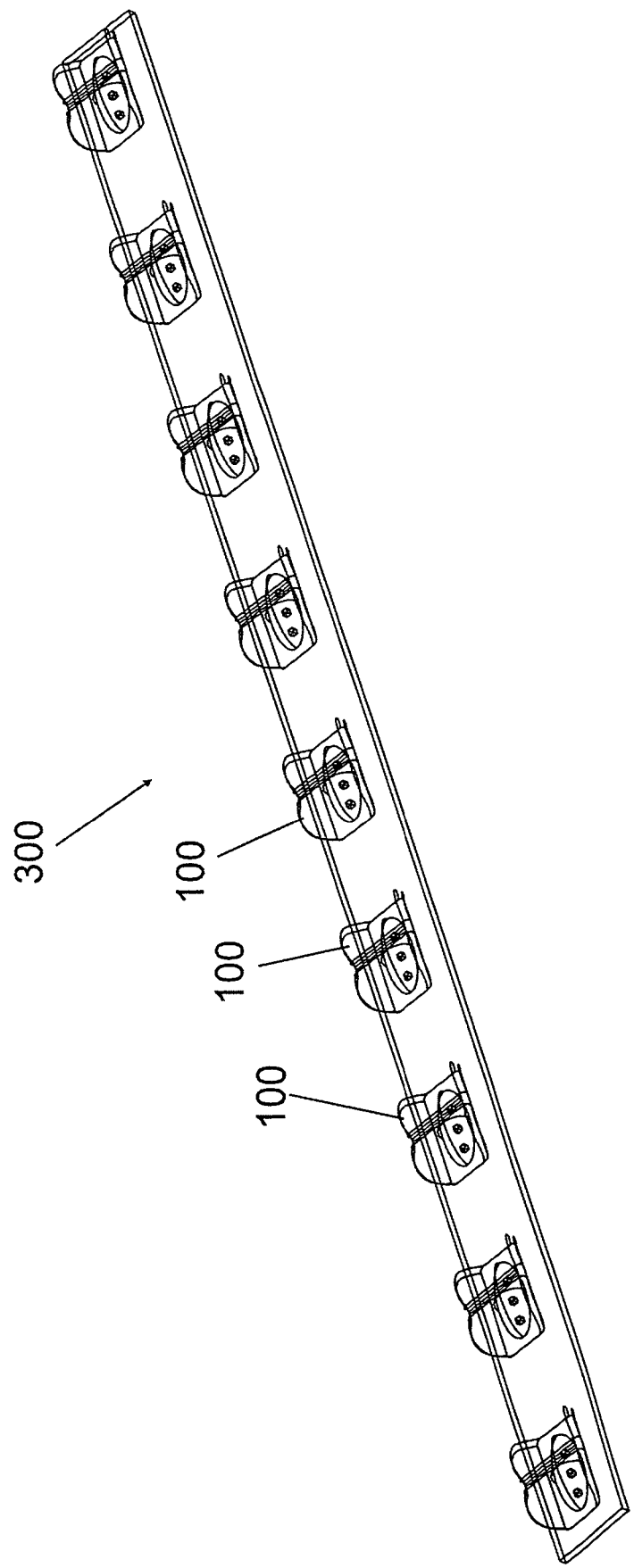
FIG. 8A is a perspective view showing the array of FIG. 8.
Figure 9:
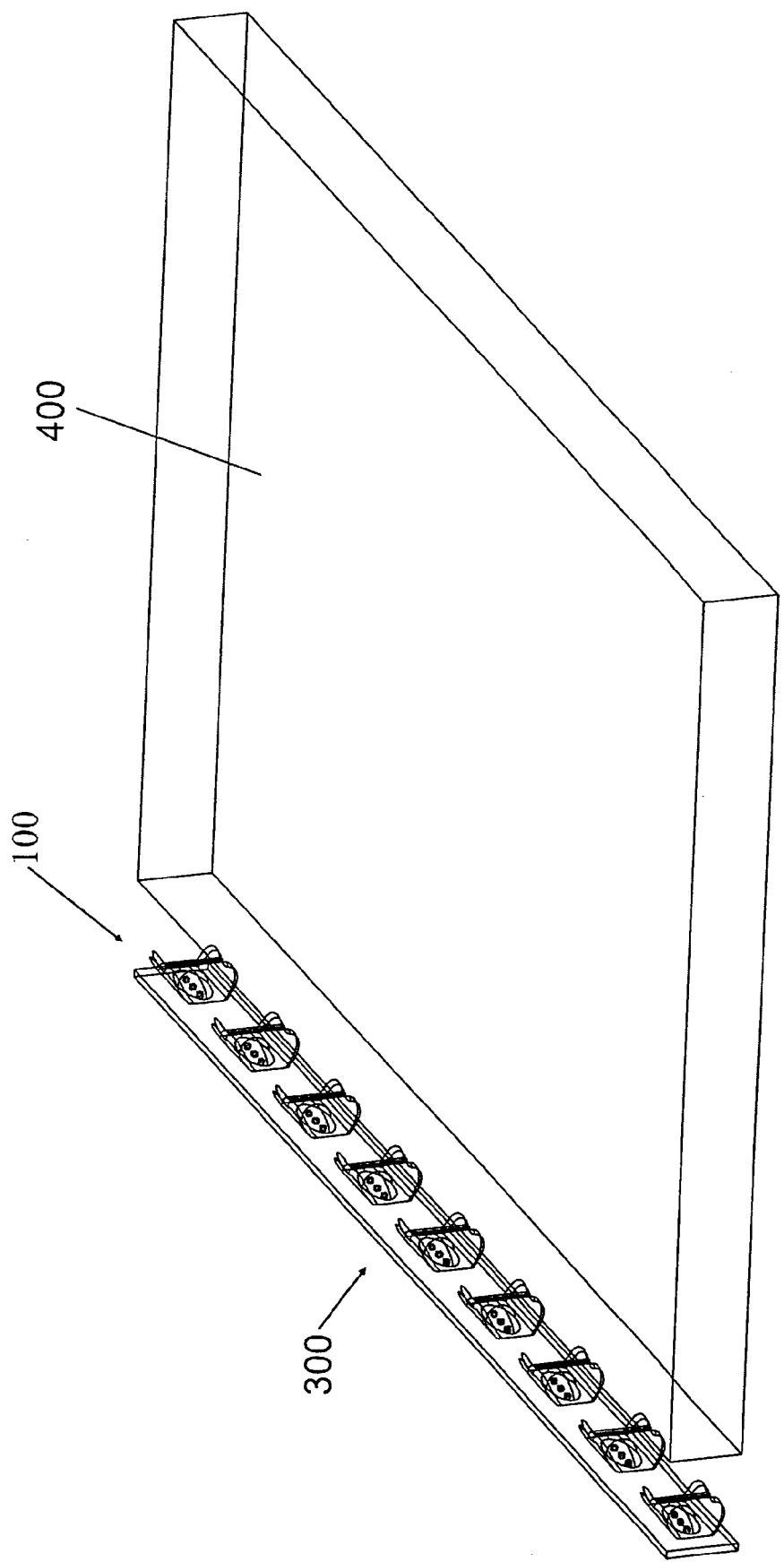
FIG. 9 illustrates a display panel assembled with a light-emitting assembly of FIG. 8.

In FIGS. 8 and 8A, there is shown an exemplary application of the light-emitting assemblies 100 of this invention by arranging the light-emitting assemblies in an array to form a module 300 of a backlight unit for providing edge-lighting for coupling onto the light guide assembly which will then form the entirety of a display panel 400 as shown in FIG. 9.

Figure 10:
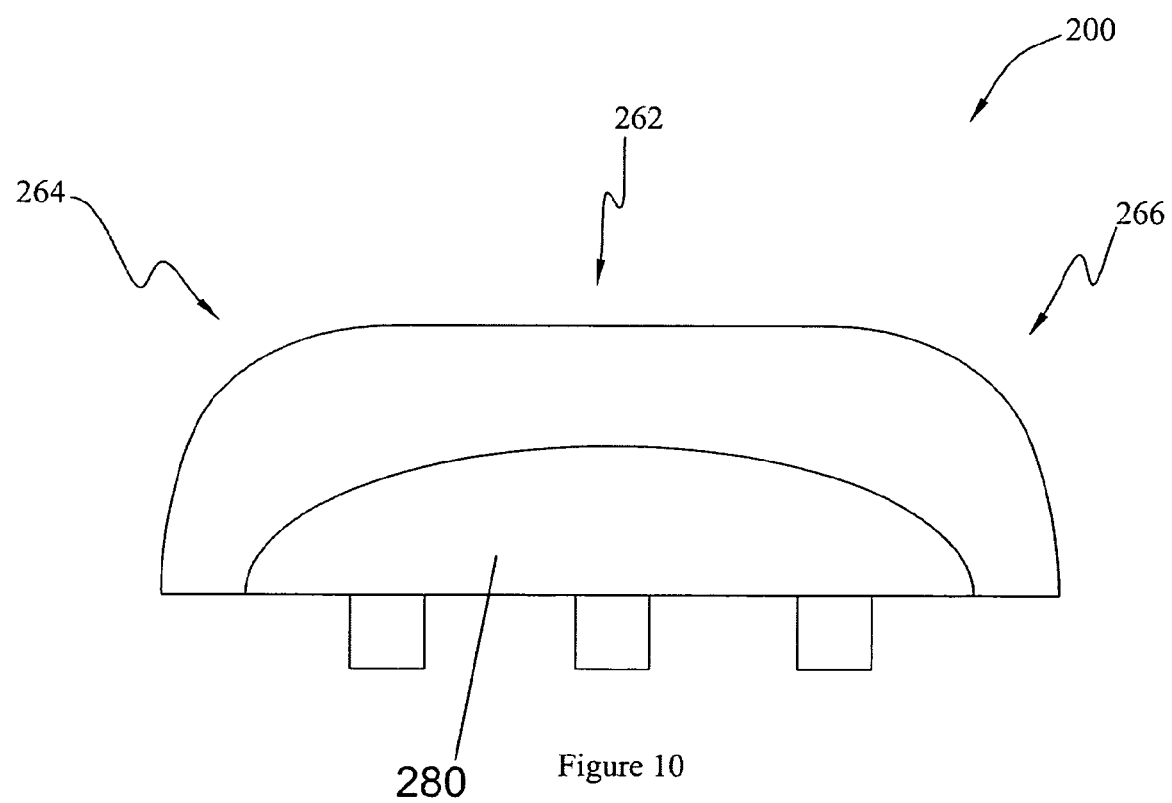
FIG. 10 depicts a cross-sectional view of a lens illustrating a second preferred embodiment of the invention.
Figure 11:
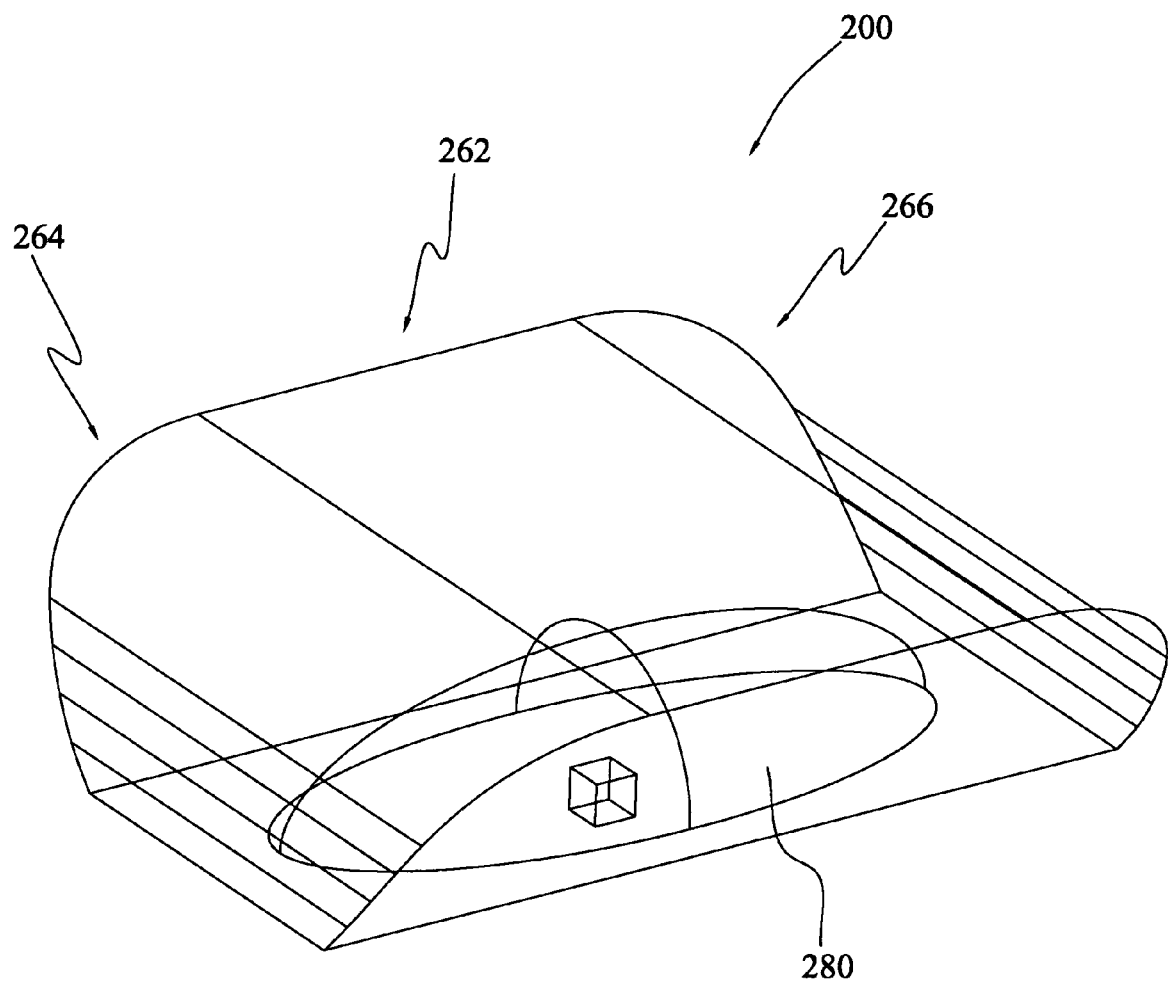
FIG. 11 is a perspective view depicting the lens of FIG. 10.

In a second preferred embodiment of a lens 200 of this invention as depicted more particularly in FIGS. 10 and 11, the lens 200 also comprises a beam diverging (or spreading) portion 262 intermediate a pair of beam converging (or condensing) portions 264 and 266, and a concave compartment 280. In this second preferred embodiment 200, the distal or exterior surface of the beam diverging portion of the lens is substantially flat while the proximal or interior surface of the beam diverging portion is concave. By having a lens comprising a flat surface in combination with a concave surface, beam diverging effect can also be obtained.

While the present invention has been explained by reference to the preferred embodiments described above, it will be appreciated that the embodiments are only illustrated as examples to assist understanding of the present invention and are not meant to be restrictive on its scope. More particularly, variations or modifications which are obvious or trivial to persons skilled in the art, as well as improvements made on the basis of the present invention, should be considered as equivalence to the present invention.

Furthermore, while the present invention has been explained by reference to optical assemblies comprising LEDs, it should be appreciated that the invention can apply, whether with or without modifications, to other semiconductor light-emitting sources without loss of generality.

The invention claimed is:

1. A light-emitting assembly for conditioning the light output of at least one light-emitting source for light guide coupling, comprising a lens and at least one light-emitting source,
   said light-emitting source having an optical output axis and said lens comprising a beam diverging portion for diverging or spreading light along a first optical plane about said optical output axis, said optical axis lying within said first optical plane,
   wherein said beam diverging portion of said lens is along said optical output axis and forward of said light-emitting source, and a beam converging portion for converging or compressing light along said first optical plane away from said optical axis is adjacent said beam diverging portion;
   wherein another beam converging portion for converging or compressing light away from said optical axis is adjacent said beam diverging portion such that said beam diverging portion of said lens is intermediate said beam converging portion and said another beam converging portion;
   said beam diverging portion, said beam converging portion and said another beam converging portion are intermediate a pair of beam collimating lens portions, and
   said pair of beam collimating lens portions being along a plane orthogonal to said first plane and being substantially parabolic such that the optical output from said light-emitting source along said orthogonal plane is collimated towards said light guide in a direction towards said optical output axis.

2. The light-emitting assembly according to claim 1, wherein both said beam diverging portion and said pair of beam converging portions are for diverging and converging light respectively along a first plane, and said pair of beam collimating lens portions are for collimating light towards said first plane.

3. The light-emitting assembly according to claim 1, wherein said beam converging portion is adapted for refracting light originating from said light-emitting source to exit from said beam converging portion at a substantially constant exit angle upon transition through said beam converging portion.

4. A light-emitting assembly according to claim 3, wherein said lens comprises a light collecting compartment within which said light-emitting source is seated, and the surface of said light collecting compartment which is proximal to said light-emitting source is concave.

5. A light-emitting assembly according to claim 4, wherein said light collecting compartment is filled with a transparent filler such as silicone.

6. A light-emitting assembly according to claim 3, wherein the distal side of said light diverging portion is concave and the distal side of said beam converging portion is convexly curved.

7. light-emitting assembly according to claim 3, wherein said light-emitting source has a characteristic viewing angle which defines an angular extent about the light-emitting source within which most optical output of said light-emitting source is contained, and said light converging portions are immediately outside the projection of said viewing.

8. A light-emitting assembly according to claim 1, wherein said beam converging portion comprises a convex lens portion, and said convex lens portion is configured so that light emitted from a light-emitting source on one side of said convex lens portion exits from the convex side of said convex lens portion at a substantially constant exit angle.

9. A light-emitting assembly according to claim 1, wherein said beam diverging portion is adapted for diverging optical output of said light-emitting source away from the optical output axis of said light-emitting source, and said beam converging portion is adapted for converging optical output of said light-emitting source also away from said optical output axis.

10. A light-emitting assembly according to claim 1, wherein said beam diverging portion comprises a double concave lens portion, and the optical axes of said double concave portion and said light-emitting source are parallel or substantially co-axial.

11. A light-emitting assembly according to claim 1, wherein said beam diverging portion is for diverging light along a first optical plane, and said pair of beam collimating lens is for collimating optical output of said light-emitting source towards a second optical plane, said second optical plane being substantially parallel to said first optical plane.

12. A light-emitting module comprising a plurality of light-emitting assemblies according to claim 1 arranged in an array.

13. A display comprising a light-emitting module of claim 12.

14. A lens for conditioning the optical output of a light-emitting source having an optical output axis and a characteristic viewing angle for coupling onto a light guide, wherein said lens comprises
   a beam diverging portion, and a beam converging portion,
   said beam diverging portion having an optical axis which is parallel or substantially co-axial with the optical output axis of said light-emitting source; and said beam diverging portion being adapted to diverge light coming from said light-emitting source along a first optical plane about the optical axis, said optical axis lying within said first optical plane,
   wherein said beam converging portion is adjacent said beam diverging portion, and said beam converging portion is arranged so as to converge light coming from said light-emitting source away from said light-emitting source; and
   wherein another beam converging portion for converging light coming from said light emitting source away from a light emitting source is adjacent said beam diverging portion such that said beam diverging portion of said lens is intermediate said beam converging portion and said another beam converging portion; and
   both said beam diverging portion and said beam converging portion and said another beam converging portion are intermediate a pair of beam collimating lens portions, and
   said pair of beam collimating lens portions being along a plane orthogonal to said first plane and being substantially parabolic such that the optical output from the light-emitting source along said orthogonal plane is collimated towards said light guide in a direction towards said optical output axis.

15. A lens according to claim 14, wherein said at least one beam diverging portion is for refracting optical signal coming form said light-emitting source to diverge along a first plane, and said beam converging portions are adapted for converging optical signal coming from said light-emitting source on said first plane and away from said optical output axis.

16. A lens according to claim 15, wherein said beam converging portions are outside the viewing angle projection of said light-emitting source.

17. A lens according to claim 14, wherein said lens comprises a light collecting compartment for receiving said light-emitting source, and the surface of said light collecting compartment which is proximal to said light-emitting source is concave.

18. A lens according to claim 14, wherein said beam converging portion comprises a convex lens portion, and said convex lens portion is configured so that light emitting from a point source on one side of said convex lens portion will exit from the convex side of said convex lens portion at a substantially constant exit angle.

19. A moulded PMMA lens according to claim 14.

* * * * *